(12) United States Patent
Kramer et al.

(10) Patent No.: US 7,192,336 B2
(45) Date of Patent: Mar. 20, 2007

(54) METHOD AND APPARATUS FOR FORMING AND USING PLANARIZING PADS FOR MECHANICAL AND CHEMICAL-MECHANICAL PLANARIZATION OF MICROELECTRONIC SUBSTRATES

(75) Inventors: Stephen J. Kramer, Boise, ID (US); Michael J. Joslyn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 248 days.

(21) Appl. No.: 10/621,193

(22) Filed: Jul. 15, 2003

(65) Prior Publication Data

US 2004/0087250 A1    May 6, 2004

Related U.S. Application Data

(62) Division of application No. 09/651,778, filed on Aug. 30, 2000, now Pat. No. 6,592,443.

(51) Int. Cl.
*B24B 1/00* (2006.01)
*C09K 3/14* (2006.01)
*B24D 11/00* (2006.01)

(52) U.S. Cl. .................. 451/41; 51/298; 451/526; 451/550

(58) Field of Classification Search .......... 51/293, 51/298, 299, 300, 305; 451/29, 36, 41, 56, 451/526, 550
See application file for complete search history.

(56) References Cited

U.S. PATENT DOCUMENTS

| 4,456,500 A | 6/1984 | Ibata |
| 5,020,283 A | 6/1991 | Tuttle |
| 5,196,353 A | 3/1993 | Sandhu et al. |
| 5,222,329 A | 6/1993 | Yu |
| 5,232,875 A | 8/1993 | Tuttle et al. |
| 5,240,552 A | 8/1993 | Yu et al. |
| 5,244,534 A | 9/1993 | Yu et al. |
| 5,314,843 A | 5/1994 | Yu et al. |
| 5,435,816 A * | 7/1995 | Spurgeon et al. ............. 51/295 |
| 5,449,314 A | 9/1995 | Meikle et al. |
| 5,486,129 A | 1/1996 | Sandhu et al. |
| 5,514,245 A | 5/1996 | Doan et al. |
| 5,540,810 A | 7/1996 | Sandhu et al. |
| 5,609,718 A | 3/1997 | Meikle |
| 5,616,069 A | 4/1997 | Walker et al. |

(Continued)

OTHER PUBLICATIONS

DuPont Cyrel® Photopolymer Flexographic Printing Plates, Process-of-Use Manual, 97 pages, E.I du Pont de Nemours and Company, Wilmington, Delaware, Dec. 1996.

*Primary Examiner*—Timothy V. Eley
(74) *Attorney, Agent, or Firm*—Perkins Coie LLP (57) ABSTRACT

Methods and apparatuses for planarizing a microelectronic substrate. In one aspect of the invention, a first portion of an energy-sensitive, non-sacrificial planarizing pad material is exposed to a selected energy without exposing a second portion of the material to the selected energy source. The planarizing pad material is exposed to a solvent to remove material from one of the first or second portions of the planarizing pad material at a faster rate than removing material from the other of the first and second portions. The process forms a plurality of recesses directly in the surface of the planarizing pad which are configured to support a planarizing liquid proximate to the surface of the planarizing pad material during planarization of the microelectronic substrate. Alternatively, the process can form a mold having protrusions that are pressed into the planarizing pad to define the recesses in the pad.

29 Claims, 5 Drawing Sheets

U.S. PATENT DOCUMENTS

| | | | |
|---|---|---|---|
| 5,618,381 A | 4/1997 | Doan et al. |
| 5,624,303 A | 4/1997 | Robinson |
| 5,643,048 A | 7/1997 | Iyer |
| 5,645,682 A | 7/1997 | Skrovan |
| 5,650,619 A | 7/1997 | Hudson |
| 5,655,951 A | 8/1997 | Meikle et al. |
| 5,658,190 A | 8/1997 | Wright et al. |
| 5,663,797 A | 9/1997 | Sandhu |
| 5,679,065 A | 10/1997 | Henderson |
| 5,690,540 A | 11/1997 | Elliott et al. |
| 5,698,455 A | 12/1997 | Meikle et al. |
| 5,702,292 A | 12/1997 | Brunelli et al. |
| 5,709,598 A * | 1/1998 | Nishio et al. ............... 451/530 |
| 5,725,417 A | 3/1998 | Robinson |
| 5,736,427 A | 4/1998 | Henderson |
| 5,738,567 A | 4/1998 | Manzonie et al. |
| 5,747,386 A | 5/1998 | Moore |
| 5,779,522 A | 7/1998 | Walker et al. |
| 5,782,675 A | 7/1998 | Southwick |
| 5,792,709 A | 8/1998 | Robinson et al. |
| 5,795,218 A | 8/1998 | Doan et al. |
| 5,795,495 A | 8/1998 | Meikle |
| 5,798,302 A | 8/1998 | Hudson et al. |
| 5,801,066 A | 9/1998 | Meikle |
| 5,823,855 A | 10/1998 | Robinson |
| 5,830,806 A | 11/1998 | Hudson et al. |
| 5,846,336 A | 12/1998 | Skrovan |
| 5,855,804 A | 1/1999 | Walker |
| 5,868,896 A | 2/1999 | Robinson et al. |
| 5,871,392 A | 2/1999 | Meikle et al. |
| 5,879,222 A | 3/1999 | Robinson |
| 5,879,226 A | 3/1999 | Robinson |
| 5,882,248 A | 3/1999 | Wright et al. |
| 5,893,754 A | 4/1999 | Robinson et al. |
| 5,894,852 A | 4/1999 | Gonzales et al. |
| 5,910,043 A | 6/1999 | Manzonie et al. |
| 5,910,846 A | 6/1999 | Sandhu |
| 5,934,980 A | 8/1999 | Koos et al. |
| 5,938,801 A | 8/1999 | Robinson |
| 5,954,912 A | 9/1999 | Moore |
| 5,972,792 A | 10/1999 | Hudson |
| 5,976,000 A | 11/1999 | Hudson |
| 5,980,363 A | 11/1999 | Meikle et al. |
| 5,981,396 A | 11/1999 | Robinson et al. |
| 5,989,470 A | 11/1999 | Doan et al. |
| 5,994,224 A | 11/1999 | Sandhu et al. |
| 5,997,384 A | 12/1999 | Blalock |
| 6,036,579 A * | 3/2000 | Cook et al. ............... 451/36 |
| 6,036,586 A | 3/2000 | Ward |
| 6,039,633 A | 3/2000 | Chopra |
| 6,040,245 A | 3/2000 | Sandhu et al. |
| 6,046,111 A | 4/2000 | Robinson |
| 6,054,015 A | 4/2000 | Brunelli et al. |
| 6,057,602 A | 5/2000 | Hudson et al. |
| 6,083,085 A | 7/2000 | Lankford |
| 6,099,394 A * | 8/2000 | James et al. ............... 451/72 |
| 6,106,351 A | 8/2000 | Raina et al. |
| 6,108,092 A | 8/2000 | Sandhu |
| 6,110,820 A | 8/2000 | Sandhu et al. |
| 6,114,706 A | 9/2000 | Meikle et al. |
| 6,120,354 A | 9/2000 | Koos et al. |
| 6,124,207 A | 9/2000 | Robinson et al. |
| 6,139,402 A | 10/2000 | Moore |
| 6,143,123 A | 11/2000 | Robinson et al. |
| 6,186,870 B1 | 2/2001 | Wright et al. |
| 6,187,681 B1 | 2/2001 | Moore |
| 6,190,494 B1 | 2/2001 | Dow |
| 6,191,037 B1 | 2/2001 | Robinson et al. |
| 6,191,864 B1 | 2/2001 | Sandhu |
| 6,200,901 B1 | 3/2001 | Hudson et al. |
| 6,203,407 B1 | 3/2001 | Robinson |
| 6,203,413 B1 | 3/2001 | Skrovan |
| 6,206,754 B1 | 3/2001 | Moore |
| 6,206,759 B1 | 3/2001 | Agarwal et al. |
| 6,206,769 B1 | 3/2001 | Walker |
| 6,210,257 B1 | 4/2001 | Carlson |
| 6,213,845 B1 | 4/2001 | Elledge |
| 6,227,955 B1 | 5/2001 | Custer et al. |
| 6,234,877 B1 | 5/2001 | Koos et al. |
| 6,234,878 B1 | 5/2001 | Moore |
| 6,238,270 B1 | 5/2001 | Robinson |
| 6,238,273 B1 | 5/2001 | Southwick |
| 6,244,944 B1 | 6/2001 | Elledge |
| 6,250,994 B1 | 6/2001 | Chopra et al. |
| 6,261,163 B1 | 7/2001 | Walker et al. |
| 6,271,139 B1 | 8/2001 | Alwan et al. |
| 6,273,101 B1 | 8/2001 | Gonzales et al. |
| 6,273,800 B1 | 8/2001 | Walker et al. |
| 6,284,660 B1 | 9/2001 | Doan |
| 6,287,879 B1 | 9/2001 | Gonzales et al. |
| 6,290,572 B1 | 9/2001 | Hofmann |
| 6,290,589 B1 | 9/2001 | Tolles |
| 6,296,557 B1 | 10/2001 | Walker |
| 6,301,006 B1 | 10/2001 | Doan |
| 6,306,008 B1 | 10/2001 | Moore |
| 6,306,014 B1 | 10/2001 | Walker et al. |
| 6,309,282 B1 | 10/2001 | Wright et al. |
| 6,312,558 B2 | 11/2001 | Moore |
| 6,319,420 B1 | 11/2001 | Dow |
| 6,323,046 B1 | 11/2001 | Agarwal |
| 6,325,702 B2 | 12/2001 | Robinson |
| 6,328,632 B1 | 12/2001 | Chopra |
| 6,331,135 B1 | 12/2001 | Sabde et al. |
| 6,331,139 B2 | 12/2001 | Walker et al. |
| 6,331,488 B1 | 12/2001 | Doan et al. |
| 6,350,180 B2 | 2/2002 | Southwick |
| 6,350,691 B1 | 2/2002 | Lankford |
| 6,352,466 B1 | 3/2002 | Moore |
| 6,352,470 B2 | 3/2002 | Elledge |
| 6,428,586 B1 * | 8/2002 | Yancey ............... 51/297 |
| 6,500,053 B2 * | 12/2002 | James et al. ............... 451/41 |
| 6,679,769 B2 * | 1/2004 | Pinheiro et al. ............ 451/526 |

* cited by examiner

METHOD AND APPARATUS FOR FORMING AND USING PLANARIZING PADS FOR MECHANICAL AND CHEMICAL-MECHANICAL PLANARIZATION OF MICROELECTRONIC SUBSTRATES

CROSS-REFERENCE TO RELATED APPLICATION

This application is a divisional application of U.S. patent application Ser. No. 09/651,778 entitled "METHOD AND APPARATUS FOR FORMING AND USING PLANARIZING PADS FOR MECHANICAL AND CHEMICAL-MECHANICAL PLANARIZATION OF MICROELECTRONIC SUBSTRATES," filed on Aug. 30, 2000, now U.S. Pat. No. 6,592,443, which is incorporated herein by reference in its entirety.

TECHNICAL FIELD

This invention relates to planarizing pads and to methods and apparatuses for forming and using planarizing pads, such as disposable and/or conditionless planarizing pads for mechanical and chemical-mechanical planarization of microelectronic substrates.

BACKGROUND

Figure 1:
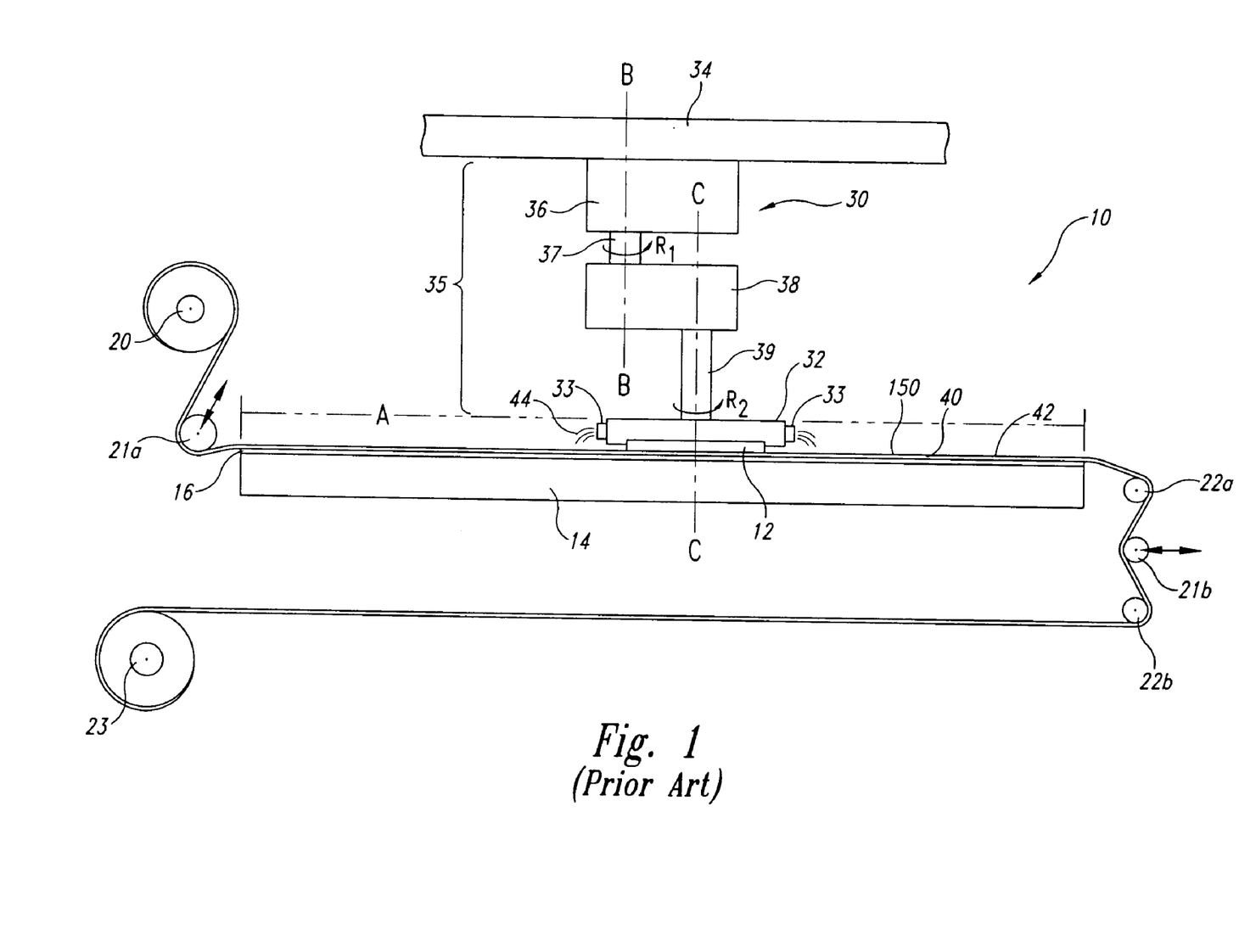
FIG. 1 is a partially schematic, side elevational view of a planarizing apparatus in accordance with the prior art.

Mechanical and chemical-mechanical planarization processes ("CMP") are used in the manufacturing of electronic devices for forming a flat surface on semiconductor wafers, field emission displays and many other microelectronic-device substrate assemblies. CMP processes generally remove material from a substrate assembly to create a highly planar surface at a precise elevation in the layers of material on the substrate assembly. FIG. 1 schematically illustrates an existing web-format planarizing machine 10 for planarizing a substrate 12. The planarizing machine 10 has a support table 14 with a top-panel 16 at a workstation where an operative portion (A) of a planarizing pad 40 is positioned. The top-panel 16 is generally a rigid plate to provide a flat, solid surface to which a particular section of the planarizing pad 40 may be secured during planarization.

The planarizing machine 10 also has a plurality of rollers to guide, position and hold the planarizing pad 40 over the top-panel 16. The rollers include a supply roller 20, first and second idler rollers 21a and 21b, first and second guide or pre-operative portion of the planarizing pad 40, and the take-up roller 23 carries a used or post-operative portion of the planarizing pad 40. Additionally, the first idler roller 21a and the first guide roller 22a stretch the planarizing pad 40 over the top-panel 16 to hold the planarizing pad 40 stationary during operation. A motor (not shown) drives at least one of the supply roller 20 and the take-up roller 23 to sequentially advance the planarizing pad 40 across the top-panel 16. Accordingly, clean pre-operative sections of the planarizing pad 40 may be quickly substituted for used sections to provide a consistent surface for planarizing and/or cleaning the substrate 12.

The web-format planarizing machine 10 also has a carrier assembly 30 that controls and protects the substrate 12 during planarization. The carrier assembly 30 generally has a substrate holder 32 to pick up, hold and release the substrate 12 at appropriate stages of the planarizing process. Several nozzles 33 attached to the substrate holder 32 dispense a planarizing solution 44 onto a planarizing surface 42 of the planarizing pad 40. The carrier assembly 30 also generally has a support gantry 34 carrying a drive assembly 35 that translates along the gantry 34. The drive assembly 35 generally has an actuator 36, a drive shaft 37 coupled to the actuator 36, and an arm 38 projecting from the drive shaft 37. The arm 38 carries the substrate holder 32 via a terminal shaft 39 such that the drive assembly 35 orbits the substrate holder 32 about an axis B—B (as indicated by arrow $R_1$). The terminal shaft 39 may also rotate the substrate holder 32 about its central axis C—C (as indicated by arrow $R_2$).

The planarizing pad 40 and the planarizing solution 44 define a planarizing medium that mechanically and/or chemically-mechanically removes material from the surface of the substrate 12. The planarizing pad 40 used in the web-format planarizing machine 10 is typically a fixed-abrasive planarizing pad in which abrasive particles are fixedly bonded to a suspension material. In fixed-abrasive applications, the planarizing solution is a "clean solution" without abrasive particles because the abrasive particles are fixedly distributed across the planarizing surface 42 of the planarizing pad 40. In other applications, the planarizing pad 40 may be a non-abrasive pad without abrasive particles, composed of a polymeric material (e.g., polyurethane) or other suitable materials. The planarizing solutions 44 used with the non-abrasive planarizing pads are typically CMP slurries with abrasive particles and chemicals to remove material from a substrate.

To planarize the substrate 12 with the planarizing machine 10, the carrier assembly 30 presses the substrate 12 against the planarizing surface 42 of the planarizing pad 40 in the presence of the planarizing solution 44. The drive assembly 35 then orbits the substrate holder 32 about the axis B—B and optionally rotates the substrate holder 32 about the axis C—C to translate the substrate 12 across the planarizing surface 42. As a result, the abrasive particles and/or the chemicals in the planarizing medium remove material from the surface of the substrate 12.

The CMP processes should consistently and accurately produce a uniformly planar surface on the substrate assembly to enable precise fabrication of circuits and photo-patterns. During the fabrication of transistors, contacts, interconnects and other features, many substrate assemblies develop large "step heights" that create a highly topographic surface across the substrate assembly. Yet, as the density of integrated circuits increases, it is necessary to have a planar substrate surface at several intermediate stages during substrate assembly processing because non-uniform substrate surfaces significantly increase the difficulty of forming sub-micron features. For example, it is difficult to accurately focus photo patterns to within tolerances approaching 0.1 micron on non-uniform substrate surfaces because sub-micron photolithographic equipment generally has a very limited depth of field. Thus, CMP processes are often used to transform a topographical substrate surface into a highly uniform, planar substrate surface.

One problem with conventional CMP methods is that the planarizing surface 42 of the planarizing pad 40 can become glazed with accumulations of slurry and/or material removed from the substrate 12 or the planarizing pad 40. One conventional approach to addressing this problem is to remove the accumulations by conditioning the planarizing pad 40, for example, by abrading the planarizing pad 40 with an abrasive disk (not shown). A drawback with this approach is that the equipment required for conditioning the planarizing pad 40 adds complexity to the planarizing machine 10 and, if the conditioning operation is performed separately from the planarizing operation, it reduces the time that the planarizing pad 40 is available for planarizing. Conventional conditioning processes can thus limit the overall efficiency of the apparatus.

One approach to address this drawback is to eliminate the need to condition the pad by making the planarizing surface or the entire planarizing pad disposable. For example, U.S. application Ser. No. 09/001,333 discloses a disposable planarizing pad film made from materials such as Mylar or polycarbonate. The pads disclosed in application Ser. No. 09/011,333 can have microfeatures of different heights that entrap small volumes of an abrasive slurry and maintain the slurry in contact with the substrate. The microfeatures can be formed using a variety of techniques, such as embossing or photo-patterning.

Figure 2A:
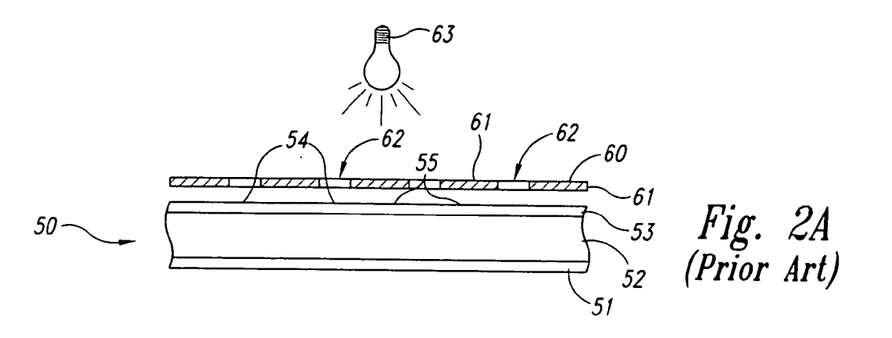
FIGS. 2A–2E are partially schematic side elevational views of a photopolymer composite undergoing a photo-etching process in accordance with the prior art.

One conventional method for photo-patterning is shown schematically in FIGS. 2A–2E. As shown in FIG. 2A, a photopolymer composite 50 is formed by disposing a photopolymer resist material 53 on a substrate polymer 52 which is supported by support layer 51. The photopolymer resist material 53 is then exposed to a radiation source 63. A mask 60 having opaque portions 61 and transmissive portions 62 blocks the radiation emitted from the radiation source 63 from striking unexposed portions 55 of the photopolymer resist material 53, while allowing the radiation to strike exposed portions 54.

Figure 2B:
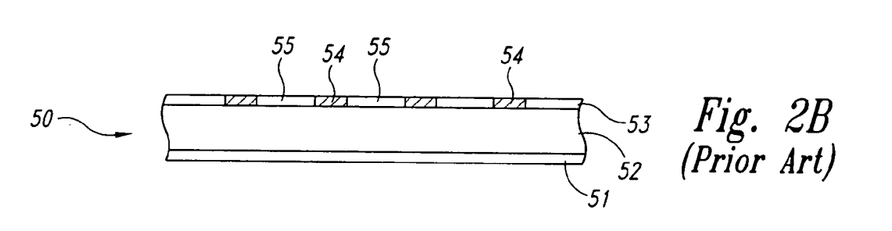

As shown schematically in FIG. 2B, the exposed portions 54 change chemical characteristics as a result of being exposed to the radiation source 63.

For example, when the photopolymer resist material 53 is initially soluble in a selected solvent, exposure to the selected radiation can change the exposed portions 54 to become insoluble in the selected solvent. Alternatively, when the photopolymer resist material is initially insoluble in the selected solvent, exposure to the selected radiation can make the exposed portions 54 soluble. In either case, the solubility of the unexposed portions 55 remains unchanged.

Figure 2C:
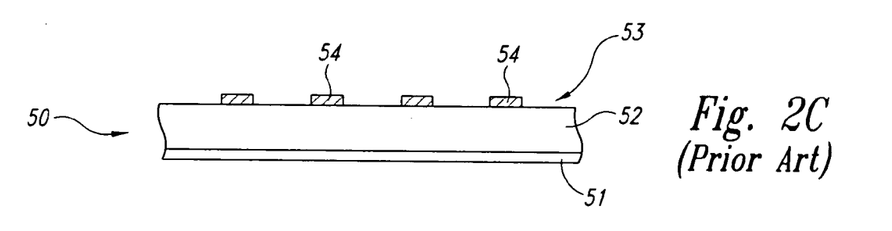
Figure 2D:
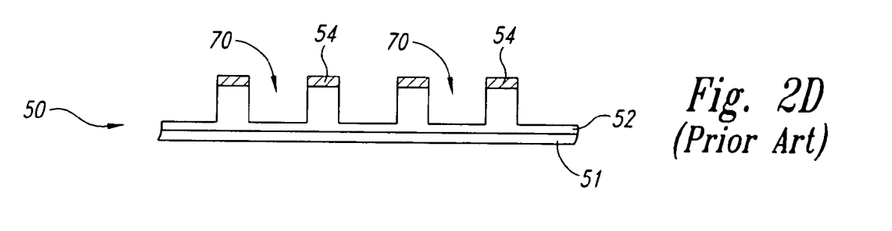
Figure 2E:
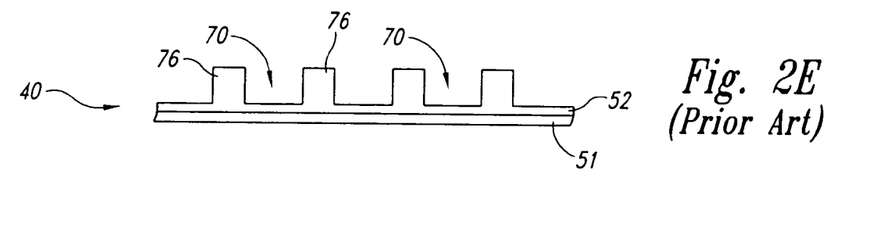

When the exposed portions 54 are rendered insoluble by exposure to the selected radiation, FIG. 2C schematically illustrates the photopolymer composite 50 after being rinsed with the selected solvent. The exposed portions 54 of the photopolymer resist material 53 remain intact and the unexposed portions have been removed by the solvent to expose the substrate polymer 52 below. The substrate polymer 52 is then etched to remove the portions of the substrate polymer material from between the exposed portions 54 of the photopolymer resist material 53 and form recesses 70, as is shown in FIG. 2D. The exposed portions 54 of the photopolymer resist material 53 are then removed, leaving the finished article (shown in FIG. 2E) having protrusions 76 separated by the recesses 70.

One drawback with the method discussed above with reference to FIGS. 2A–2E is that separate steps are required to place the photopolymer resist material 53 on the substrate polymer 52 and remove the photopolymer resist material 53 from the substrate polymer 52 after the recesses 70 are formed. Furthermore, the solvent that removes the photopolymer resist material 53 may be different than the solvent that removes the underlying substrate polymer 52, requiring the manufacturer to keep multiple solvents on hand.

One method for reducing the number of manufacturing steps and solvents associated with photoresistive techniques used in the printing industry is to etch the recesses 70 directly in a photosensitive material. For example, Cyrel®, available from E.I. du Pont de Nemours and Co. of Wilmington, Del., is used to make printing plates by forming surface features directly in a photosensitive material without separately etching the material below. However, such printing plates are generally unsuitable for application to planarizing pads because the surfaces of the plates have deep recesses that separate inked regions from non-inked regions of the plates to prevent blurring of the resulting image. These deep recesses will not adequately support the planarizing liquid adjacent to the surface of a microelectronic substrate, reducing the effectiveness of the planarizing pad.

SUMMARY OF THE INVENTION

The present invention is directed toward planarizing pads for planarizing microelectronic substrates, methods for forming planarizing pads, and methods for planarizing the microelectronic substrates. In one aspect of the invention, the planarizing pad is formed by exposing a first portion of a surface of an energy-sensitive, non-sacrificial planarizing pad material to a selected energy source without exposing a second portion of the surface (adjacent to the first portion) to the selected radiation energy source. The method can further include exposing the planarizing pad material to a solvent to remove material from one of the first and second portions of the planarizing pad material at a greater rate than removing material from the other of the first and second portions. The process forms a plurality of recesses directly in the surface of the planarizing pad material, with the recesses configured to support a planarizing liquid proximate to the surface of the planarizing pad material during planarization of the microelectronic substrate.

The planarizing pad can have a variety of shapes and features. For example, the planarizing pad can be elongated and can extend between a supply roller and a take-up roller for use with a web-format planarizing machine. Alternatively, the planarizing pad can have a circular planform shape for use with a conventional rotary format planarizing machine. In either of these embodiments, the planarizing pad can have abrasive elements fixedly disbursed therein and/or can be used with a planarizing liquid having a suspension of abrasive particles.

In another aspect of the invention, the steps discussed above with respect to the radiation-sensitive planarizing pad material can be used to process a radiation-sensitive mold material into a mold. The mold can be wrapped around a roller which rotates to engage the planarizing pad material and emboss the planarizing pad material with recesses and texture elements, or the mold can have a flat shape which presses against the planarizing pad material to form recesses and texture elements in the planarizing pad material.

DETAILED DESCRIPTION OF THE INVENTION

The present disclosure describes planarizing pads, methods for making planarizing pads, and methods for the mechanical and/or chemical-mechanical planarizing of substrate assemblies used in the fabrication of microelectronic substrates. Many specific details of certain embodiments of the invention are set forth in the following description, and in FIGS. 3A–7, to provide a thorough understanding of the embodiments described herein. One skilled in the art, however, will understand that the present invention may have additional embodiments, or that the invention may be practiced without several of the details described in the following description.

Figure 3A:
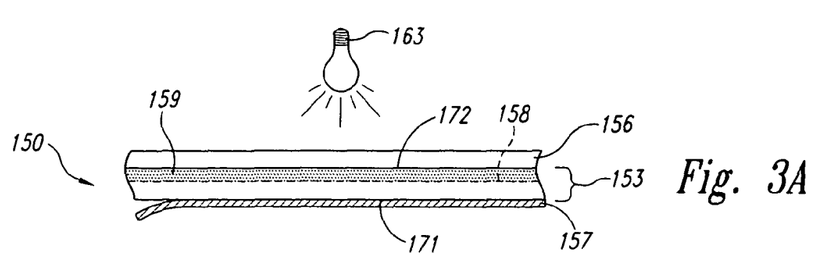
FIGS. 3–3D are partially schematic side elevational views of a photopolymer composite undergoing a photo-etching process to produce a planarizing surface in accordance with an embodiment of the present invention.

FIG. 3A is a partially schematic, partial cross-sectional side elevational view of a portion of a photosensitive composite 150 for forming a planarizing pad in accordance with an embodiment of the invention. In one embodiment, the composite 150 includes a layer of photopolymer resist material 153 that can undergo a chemical change upon exposure to radiation at a selected wavelength. The photopolymer resist material 153 can have a forward surface 171 (facing downwardly in FIG. 3A) and a rear surface 172 facing opposite the forward surface 171. A removable protective film 157 is positioned adjacent to the forward surface 171 to protect the forward surface 171 during handling. A backing layer or substrate 156 is positioned adjacent to the rear surface 172 to support the photopolymer resist material 153. Photosensitive composites 150 of the type shown in FIG. 3A are commercially available from du Pont de Nemours and Co. of Wilmington, Del. under the name Cyrel®.

In one embodiment, a portion of the photopolymer resist material 153 adjacent to the backing layer 156 can be chemically altered or "set" to resist etching and provide an etch stop within the photopolymer resist material 153. For example, an energy source 163 can emit selected radiation that passes through the backing layer 156 and penetrates through the rear surface 172 of the photopolymer resist material 153 to a selected pre-exposure depth indicated by etch-stop line 158, setting the portion of the backing layer 156 between the rear surface 172 and the etch-stop line 158. Accordingly, the backing layer 156 can include a polyester such as Mylar®, available from du Pont de Nemours and Co. or another material that is transparent to the selected radiation. In one embodiment, the pre-exposure depth can be from about 0.001 inch to about 0.008 inch and in other embodiments the pre-exposure depth can have other values. The pre-exposure depth generally depends on the overall thickness of the photopolymer resist material 153 and the dimensions of the features to be formed therein. In either embodiment, the pre-exposure step produces a pre-exposed portion 159 of the photopolymer resist material 153 that resists subsequent etching, as will be discussed in greater detail below with reference to FIG. 3C. Alternatively, the pre-exposure process and the pre-exposed portion 159 can be eliminated and other methods can be used to halt subsequent etching within the photopolymer resist material 153, or the subsequent etching can continue through the photopolymer resist material 153 to the backing layer 156.

Figure 3B:
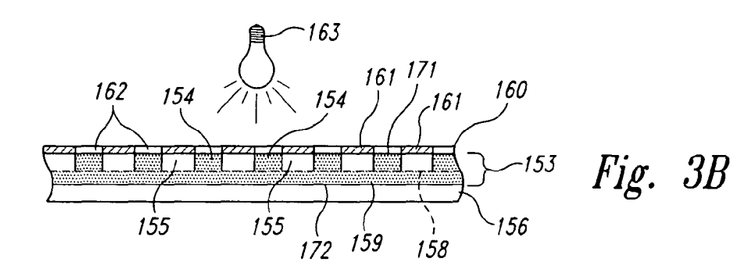

Once the pre-exposure operation has been completed, the composite 150 is inverted, as shown in FIG. 3B, so that the rear surface 172 of the photopolymer resist material 153 faces downwardly and the forward surface 171 faces upwardly. The protective layer 157 (FIG. 3A) is removed from the forward surface 171 and a mask 160 is positioned on or adjacent to the forward surface 171. The mask 160 includes opaque portions 161 that block the selected radiation from striking portions of the forward surface 171, and transmissive portions 162 that allow the selected radiation to strike other portions of the forward surface 171. In one embodiment, the transmissive portions 162 include apertures in the mask 160. Alternatively, the transmissive portions 162 can be transparent or translucent to the selected radiation, so long as they allow at least some of the selected radiation to pass through the mask 160.

In one embodiment, the opaque portions 161 and the transmissive portions 162 of the mask 160 can be evenly spaced to produce an even pattern of recesses in the planarizing surface of the resulting planarizing pad, as will be discussed in greater detail below. In one alternative embodiment the opaque portions and the transmissive portions can be concentrated in one or more regions of the composite 150. In another alternative embodiment, the opaque portions 161 and the transmissive portions 162 can be randomly spaced to produce a corresponding random arrangement of recesses, as will be discussed in greater detail below with reference to FIG. 4. In any of the foregoing embodiments, the composite 150 and the mask 160 can be exposed to radiation emitted from the energy source 163 to illuminate exposed portions 154 of the photopolymer resist material 153 while unexposed portions 155 remain shielded from exposure to the radiation. Alternatively, the energy source 163 can selectively direct focused energy to the exposed portions 154 without the presence of the mask 160.

In a "negative resist process" according to one embodiment, the photopolymer resist material is initially soluble in a selected solvent. The exposed portions 154 become generally insoluble (or less soluble) in the solvent after being exposed to the selected radiation, and the unexposed portions 155 remain soluble in the selected solvent. Alternatively, in a "positive resist process," an initially insoluble photopolymer resist material 153 can be selected to undergo the opposite change upon exposure to a selected radiation, such that the exposed portions 154 become soluble (or more soluble) and the unexposed portions remain insoluble (or less soluble). In either embodiment, the energy source 163 can be selected to produce the desired change in the photopolymer resist material 153. For example, in one embodiment, the energy source 163 can be selected to emit ultraviolet radiation, that renders the exposed portions 154 insoluble when exposed to solvents such as nonyl acetate and/or benzyl alcohol. Alternatively, the energy source 163 can emit other radiation (such as neutron beams or electron beams) to change the solubility of other radiation-sensitive materials. When the photopolymer resist material 153 has been pre-exposed (as discussed above with reference to FIG. 3A), the composite 150 is exposed to the selected radiation for long enough to cause the exposed portions 154 to change solubility down to the etch-stop line 158. Where the photopolymer resist material 153 has not been pre-exposed, the composite 150 can be exposed to the selected radiation for a period of time sufficient to change the solubility of the photopolymer resist material 153 to a predetermined depth.

Figure 3C:
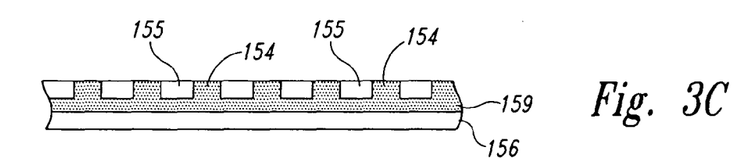
Figure 3D:
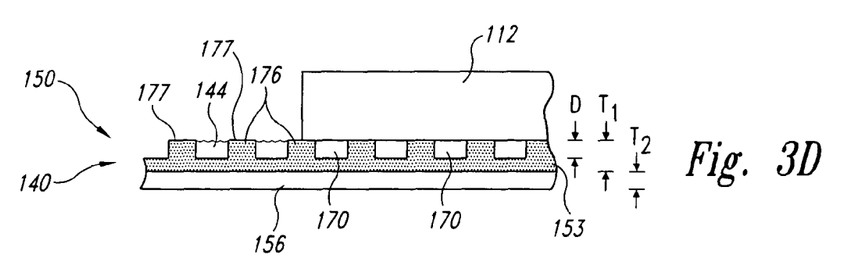

After the exposed portions 154 have changed solubility, the mask 160 is removed, as shown in FIG. 3C. The composite 150 is then rinsed with a solvent that selectively dissolves or etches the unexposed portions 155 while leaving the exposed portions 154 at least substantially intact. As shown in FIG. 3D, the resulting topography includes a plurality of recesses 170 separated by upwardly projecting contact elements 176 that contact a microelectronic substrate or substrate assembly 112 (hereinafter microelectronic substrate) during planarization. The composite 150 can be heat cured to strengthen and harden the contact elements 176, or the curing process can be eliminated, depending on the strength of the photopolymer resister material. In one embodiment, the tops or engaging contact surfaces 177 of the contact elements 176 are each at approximately the same height so that the tops 177 define a generally flat plane. Alternatively, the tops 177 can be at different heights. In either embodiment, the composite 150 can form a planarizing pad 140 for use with an apparatus generally similar to that shown in FIG. 1 to planarize the microelectronic substrate 112.

In one embodiment, the recesses 170 of the planarizing pad 140 are configured to contain a planarizing liquid 144 and keep the planarizing liquid 144 in contact with the microelectronic substrate 112 as the substrate 112 is planarized in a manner generally in accordance with that discussed above with reference to FIG. 1. Accordingly, the depth D of the recesses 170 can range from about 0.001 inch to 0.004 inch. The thickness $T_1$ of the photopolymer resist material 153 can range from approximately 0.002 inch to approximately 0.010 inches. The thickness $T_2$ Of the backing material 156 can range from about 0.001 inches to about 0.010 inch. Alternatively, the thicknesses $T_1$ and $T_2$ of the resist material 153 and the backing material 156, and the depth D of the recesses 170, can have other values so long as the planarizing pad 140 can effectively keep the planarizing liquid 144 in contact with the substrate 112. In one aspect of this embodiment, the planarizing pad 140 can be relatively thin to allow the planarizing pad 140 to flex easily as it passes over the rollers shown in FIG. 1. Alternatively, the planarizing pad 140 can have a greater thickness, for example, when the planarizing pad 140 remains flat throughout its operation, as will be discussed in greater detail below with reference to FIG. 7.

An advantage of several embodiments of the planarizing pad 140 discussed above with reference to FIGS. 3A–3D is that they eliminate the need to periodically condition the pad 140 because it is more economical to discard used pads than to condition them. The planarizing pad 140 can be relatively inexpensive to fabricate compared to many conventional pads. This is unlike some conventional planarizing pads, which are expansive and must be reconditioned when they are worn, potentially increasing the time and effort required to keep the planarizing machine operating at peak efficiency.

An advantage of several embodiments of the planarizing pad 140, when compared to conventional disposable planarizing pads, is that it can be manufactured using a photoresist process that forms the recesses 170 and contact elements 176 integrally in a single layer of photosensitive material, rather than requiring a sacrificial polymer layer, as was discussed above with reference to FIGS. 2A–2E. Accordingly, embodiments of the planarizing pad 140 may be simpler and less expensive to manufacture than some conventional planarizing pads.

Still a further advantage of several embodiments of the planarizing pad 140, when compared to printing plates formed with photoresist techniques, is that the recesses 170 are shallow enough to support the planarizing liquid 144 adjacent to the substrate 112. Accordingly, the planarizing pad 140 can have recesses 170 that are unlike the recesses of some printing plates, which are deliberately made deeper than those of the planarizing pad 140 to prevent ink from filling the recesses and blurring the printed images.

Figure 4:
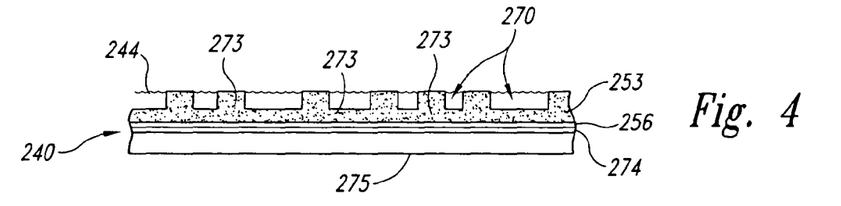
FIG. 4 is a partially schematic, side elevational view of a planarizing pad having fixed abrasive elements in accordance with another embodiment of the invention.

FIG. 4 is a partially schematic, partial cross-sectional side elevational view of a planarizing pad 240 formed in accordance with another embodiment of the invention. In one aspect of this embodiment, the planarizing pad 240 can include a layer of photopolymer resist material 253 formed in general accordance with the steps outlined above with reference to FIGS. 3A–3D, but which includes a plurality of fixed abrasive elements 273. The fixed abrasive elements 273 can be selected from alumina, titania, ceria, silica, calcium carbonate or other substances that are effective at removing material from the microelectronic substrate 112 (FIG. 3D), and are also compatible with both the photopolymer resist material 253 and the processes discussed above with reference to FIGS. 3A–3D.

In one embodiment, the photopolymer resist material 253 can include additives, such as chalk, to improve the uniformity of the distribution of the abrasive elements 273. In other embodiments, the photopolymer resist material 253 can include chalk or other additives, such as carbonaceous materials, to control the hardness of the planarizing pad 240. For example, the photopolymer resist material 253 can include a suspension of graphite particles to soften the planarizing pad 240 or an amorphous carbon material to harden the planarizing pad 240. In one aspect of this embodiment, the planarizing pad 240 can have a hardness of from about 50 to about 80 on the Shore D hardness scale. In other embodiments, the photopolymer resist material 253 can include other substances to control specific characteristics of the abrasive elements 273 and/or the overall characteristics of the planarizing pad 240.

One feature of the planarizing pad 240 shown in FIG. 4 is that the fixed abrasive elements 273 can eliminate the need for abrasive particles in the planarizing liquid 244 disposed on the planarizing pad 240. And advantage of this feature is that it generally provides a desired distribution of fixed abrasive elements 273 in contact with the planarized surface of the substrate 112. This is an improvement over providing abrasive particles in a slurry because the slurry can be squeezed out from between the substrate 112 and the planarizing pad 240 such that distribution of abrasive particle contacting the substrate assembly 112 is not easily controlled.

Another feature of the planarizing pad 240 shown in FIG. 4 is that it can include a backing layer 256 attached with an adhesive 274 to a support layer 275.

An advantage of this arrangement is that the support layer 275 can provide additional rigidity and support for the photopolymer resist material 253. In one embodiment, the support layer 275 can be sized to allow the planarizing pad 240 to bend around the rollers of a web-format planarizing machine, or the support layer 275 can be relatively thick and the planarizing pad 240 can remain flat for either web-format or rotary planarizing machines (discussed in greater detail below with reference to FIG. 7). Where the support layer 275 is not included, the planarizing pad 240 can rest directly on a top-panel, or platen of a planarizing machine.

Another feature of the planarizing pad 240 shown in FIG. 4 is that the spacing between adjacent recesses 270 and/or the size of the recess 270 can vary across the pad 240 either uniformly or non-uniformly. In one aspect of this embodiment, the spacing between adjacent recesses 270 can be random. Alternatively, the spacing can be closer in one portion of the planarizing pad 240 than in another. In other embodiments, the recesses can have other spacing or other size arrangements. Regardless of the spacing and/or size of the recesses 270 on the planarizing pad 240, an advantage of the mask 160 (FIG. 3B) used to define the spacing between the recesses 270 is that the mask 160 can accurately control the spacing between the recesses 270.

Another advantage is that the same mask 160 can be used repeatedly to place the same pattern of recesses 270 on a series of planarizing pads 240. Accordingly, worn planarizing pads can be removed and replaced with identical fresh planarizing pads, reducing or eliminating the need for adjusting the operating characteristics of the planarizing machine on which the planarizing pads to account for variations from one planarizing pad 240 to the next.

Figure 5:
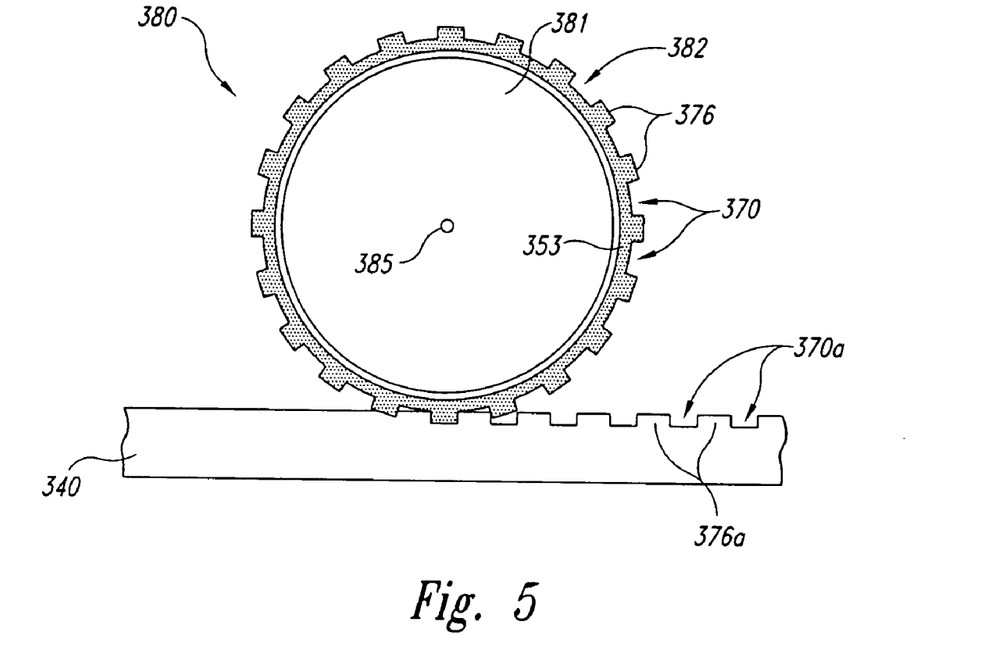
FIG. 5 is a partially schematic, side elevational view of a rotary embossing drum for forming a planarizing surface in accordance with still another embodiment of the invention.

FIG. 5 is a side elevational view of a planarizing pad 340 formed in accordance with another embodiment of the invention. The planarizing pad 340 can include a thermoplastic or uncured thermoset material that is embossed with a pattern of recesses 370a and roughness elements 376a arranged either randomly, variably, or uniformly, as discussed above. The recesses 370a and the roughness elements 376a can be formed by a mold 380 which includes an embossing wheel 381 having an embossing surface 382 defined by a layer of photopolymer resist material 353. Accordingly, the photopolymer resist material 353 can include recesses 370 and protrusions or texture elements 376 formed in generally the same manner as discussed above with reference to FIGS. 3A–4. As the embossing wheel 381 rotates about an axis 385 generally transverse to the plane of FIG. 5, the protrusions 376 press into the planarizing pad 340 to form the recesses 370a and the roughness elements 376a. When the polishing pad 340 includes a thermoset material, the polishing pad 340 can be cured after the recesses 370a and roughness elements 376a are formed to harden the definition of these features. The polishing pad 340 can also include abrasive elements generally similar to those discussed above with reference to FIG. 4.

An advantage of the process discussed above with reference to FIG. 5 is that a single surface formed with the photopolymer resist material 353 can generate a large number of planarizing pads 340. A further advantage is that the embossing wheel 381 can easily generate a single elongated planarizing pad 340 for use with a web-format planarizing machine.

Figure 6:
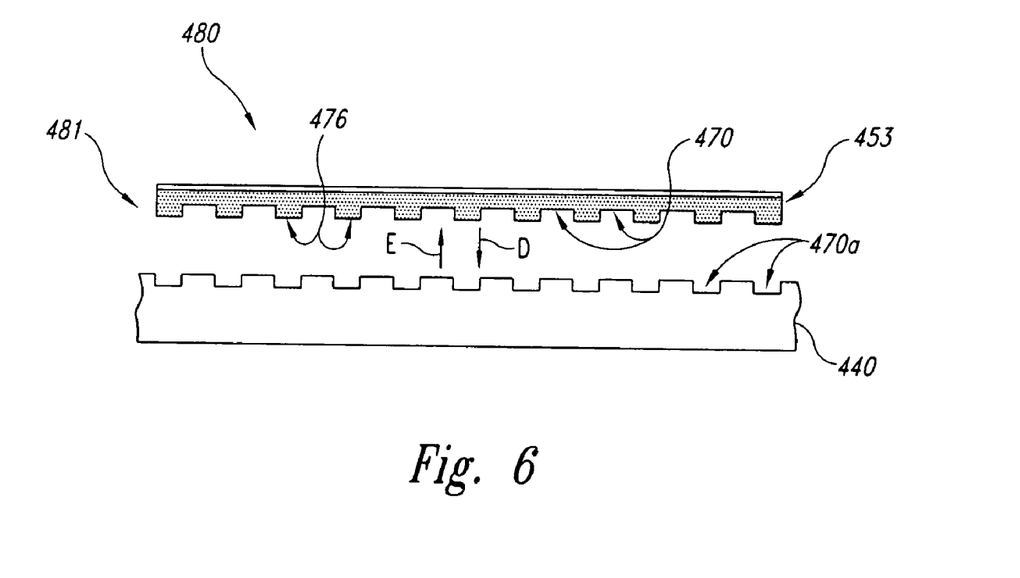
FIG. 6 is a partially schematic, side elevational view of an embossing plate for forming a planarizing surface in accordance with yet another embodiment of the invention.

FIG. 6 is a side elevational view of a planarizing pad 440 formed in accordance with another embodiment of the invention. The planarizing pad 440 can be formed from a thermoplastic or uncured thermoset material that is embossed with a mold 480 that includes a flat embossing plate 481. The embossing plate 481 has protrusions 476 and recesses 470 formed in a layer of photopolymer resist material 453 in a manner generally similar to that discussed above with reference to FIGS. 3A–4. The mold 480 can be lowered and raised as indicated by arrows D and E, respectively, to form recesses 470a by pressing the protrusions 476 into the planarizing pad 440. In one embodiment, the flat plate 481 can be sized to produce a single planarizing pad 440 with one pressing cycle. Alternatively, the flat plate 481 can be repeatedly pressed into successive portions of an elongated planarizing pad, as the pad and the flat plate 481 move laterally relative to one another, to emboss the entire length of the planarizing pad 440.

Figure 7:
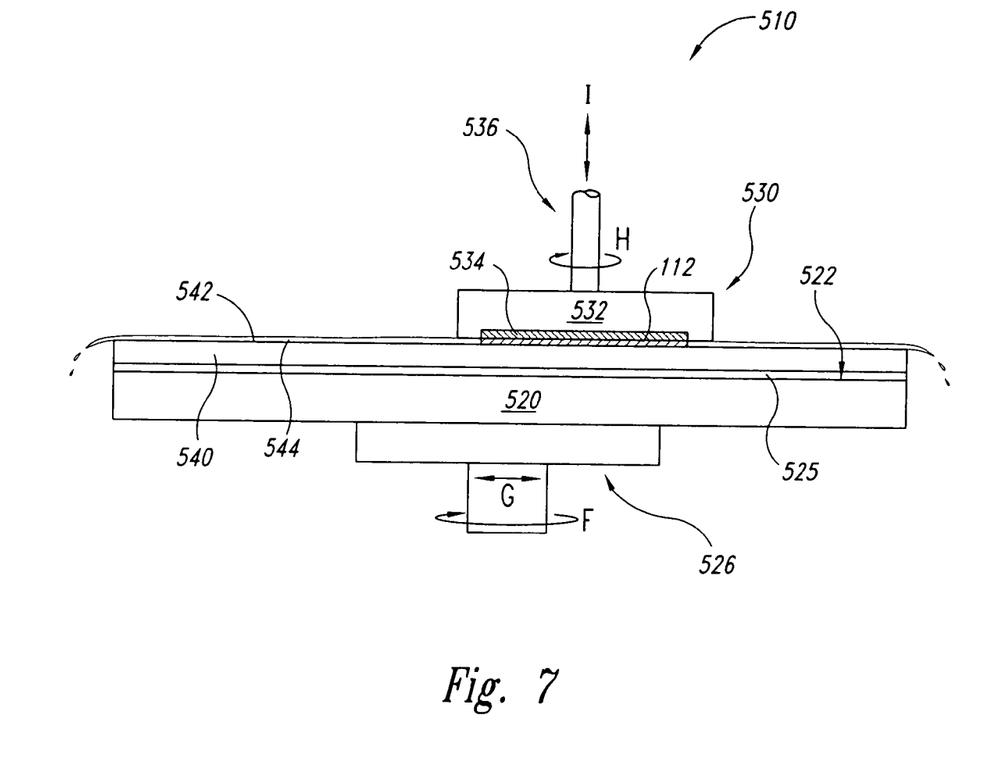
FIG. 7 is a partially schematic, side elevational view of an apparatus having a planarizing pad in accordance with still another embodiment of the invention.

FIG. 7 is a partially schematic, partial cross-sectional side elevational view of a planarizing machine 510 with a generally circular platen or table 520, a carrier assembly 530, a planarizing pad 540 positioned on the table 520, and a planarizing fluid 544 on the planarizing pad 540. The planarizing machine 510 may also have an under-pad 525 attached to an upper surface 522 of the platen 520 for supporting the planarizing pad 540. A drive assembly 526 rotates (arrow F) and/or reciprocates (arrow G) the platen 520 to move the planarizing pad 540 during planarization.

The carrier assembly 530 controls and protects the substrate 112 during planarization. The carrier assembly 530 typically has a substrate holder 532 with a pad 534 that holds the substrate 112 via suction. A drive assembly 536 of the carrier assembly 530 typically rotates and/or translates the substrate holder 532 (arrows H and I, respectively). Alternatively, the substrate holder 532 may include a weighted, free-floating disk (not shown) that slides over the planarizing pad 540.

The planarizing pad 540 can have recesses and roughness elements formed by any of the methods discussed above with reference to FIGS. 3A–6. To planarize the substrate 112 with the planarizing machine 510, the carrier assembly 530 presses the substrate 112 against a planarizing surface 542 of the planarizing pad 540 in the presence of the planarizing fluid 544. The platen 520 and/or the substrate holder 532 then move relative to one another to translate the substrate 112 across the planarizing surface 542. As a result, the abrasive particles and/or the chemicals in the planarizing medium remove material from the surface of the substrate 112.

From the foregoing, it will be appreciated that, although specific embodiments of the invention have been described herein for purposes of illustration, various modifications may be made without deviating from the spirit and scope of the invention. For example, the process steps discussed above with reference to FIGS. 3A–3D can be performed in a batch operation or in a continuous or semi-continuous operation as the polishing pad material moves from one process station to the next. Accordingly, the invention is not limited except as by the appended claims.

The invention claimed is:

1. A method for forming a planarizing pad for planarizing a microelectronic substrate, comprising:

selectively exposing a first portion of a first surface of an energy-sensitive planarizing pad material to a selected energy source without exposing a second portion of the first surface facing in generally the same direction as the first portion and adjacent to the first portion, the energy-sensitive planarizing pad material including fixed abrasive elements for abrading the microelectronic substrate;

forming a plurality of recesses and contact surfaces at the first surface of the planarizing pad material configured to support a planarizing liquid proximate to the first surface of the planarizing pad material during planarization of the microelectronic substrate by exposing the planarizing pad material to a solvent to remove material from one of the first and second portions of the planarizing pad material at a greater rate than removing material from the other of the first and second portions;

selecting a substrate material to transmit a selected radiation from the energy source;

attaching the substrate material to a second surface of the planarizing pad material to support the planarizing pad material, the second surface facing opposite from the first surface; and exposing the second surface to the selected radiation to cure the planarizing pad material to a selected depth from the second surface by irradiating the substrate material with the selected radiation and passing the selected radiation through the substrate material to the second surface of the planarizing pad material.

2. The method of claim 1, further comprising:
selecting the planarizing pad material to have a thickness of from about 0.002 inch to about 0.010 inch; and
forming the recesses in the surface of the planarizing pad material to have a depth of from about 0.001 inch to about 0.004 inch measured from the surface of the planarizing pad material.

3. The method of claim 1, further comprising selecting the first portion of the surface of the planarizing pad material to include a plurality of uniformly spaced regions.

4. The method of claim 1, further comprising selecting the first portion of the surface of the planarizing pad material to include a plurality of randomly spaced regions.

5. The method of claim 1, further comprising selecting the substrate material to include polyester.

6. The method of claim 1, further comprising selecting the substrate material to have a thickness of from about 0.001 inch to about 0.010 inch.

7. The method of claim 1 wherein the planarizing pad material has a protective film adjacent to the surface of the planarizing pad material, further comprising removing the protective film after exposing the planarizing pad material to the energy source and before exposing the planarizing pad material to the solvent.

8. The method of claim 1, further comprising curing the planarizing pad material at an elevated temperature to strengthen and harden the planarizing pad material.

9. The method of claim 1 wherein exposing the planarizing pad material to the selected energy source includes exposing the planarizing pad material to ultraviolet radiation.

10. The method of claim 1, further comprising selecting the solvent from nonyl acetate and benzyl alcohol.

11. The method of claim 1 wherein the substrate material is a first substrate material, and wherein the method further comprises:
attaching the planarizing pad material to an elongated second substrate material to form an elongated planarizing pad; and
rolling the elongated planarizing pad upon itself to form a roll.

12. The method of claim 1, further comprising selecting the planarizing pad material to have a generally circular planform shape.

13. The method of claim 1 wherein selectively exposing the first portion of the planarizing pad material without exposing the second portion of the planarizing pad material includes positioning a mask proximate to the surface of the planarizing pad material with an opaque region of the mask aligned with the second portion of the planarizing pad material to block the selected radiation from the selected energy source from striking the second portion and an at least partially transmissive region of the mask aligned with the first portion of the planarizing pad material to transmit the selected radiation to the first portion.

14. The method of claim 1, further comprising selecting the planarizing pad material to include a photopolymer.

15. The method of claim 1 wherein exposing the first portion of the planarizing pad material to the selected energy source includes increasing a solubility of the first portion.

16. The method of claim 1 wherein exposing the first portion of the planarizing pad material to the selected energy source includes decreasing a solubility of the first portion.

17. The method of claim 1, further comprising selecting the planarizing surface material to have a Shore D hardness in the range of from about 50 to about 80.

18. The method of claim 1 wherein the planarizing pad material includes an elongated film having a first end and a second end, further wherein exposing the planarizing pad material to a selected energy source and exposing the planarizing pad material to a solvent are each performed at one or more stations between the first end and the second end in a continuous process as the planarizing pad material moves relative to the one or more stations.

19. The method of claim 1, further comprising curing the planarizing pad material at an elevated temperature to strengthen the first surface.

20. A method for forming a fixed-abrasive planarizing pad for planarizing a microelectronic substrate, comprising:
distributing abrasive elements in a radiation-sensitive planarizing pad material;
selectively irradiating a first portion of a first surface of the planarizing pad material with a selected radiation without irradiating a second portion of the first surface of the planarizing pad adjacent to the first portion;
forming a plurality of recesses and contact surfaces at the first surface of the planarizing pad material configured to support a planarizing liquid proximate to the first surface of the planarizing pad material during planarization of the microelectronic substrate by exposing the planarizing pad material to a solvent to remove material from one of the first and second portions of the planarizing pad material at a greater rate than removing material from the other of the first and second portions;
selecting a substrate material to transmit a selected radiation;
attaching the substrate material to a second surface of the planarizing pad material to support the planarizing pad material, the second surface facing opposite from the first surface; and
exposing the second surface to the selected radiation to cure the planarizing pad material to a selected depth from the second surface by irradiating the substrate material with the selected radiation and allowing the selected radiation to pass through the substrate material to the second surface of the planarizing pad material.

21. The method of claim 20, further comprising selecting the abrasive elements from ceria, titania, alumina, and calcium carbonate.

22. The method of claim 20, further comprising distributing chalk in the planarizing pad material to uniformly disperse the abrasive elements in the planarizing pad material.

23. The method of claim 20 further comprising selecting the planarizing pad material to include a carbonaceous material to control a hardness of the planarizing pad material.

24. The method of claim 23 wherein selecting the carbonaceous material includes selecting graphite.

25. The method of claim 23 wherein selecting the carbonaceous material includes selecting an amorphous carbon material.

26. The method of claim 20, further comprising:
selecting the planarizing pad material to have a thickness of from about 0.002 inch to about 0.010 inch; and
forming the recesses in the surface of the planarizing pad material to have a depth of from about 0.001 inch to about 0.004 inch measured from the surface of the planarizing pad material.

27. The method of claim 20, further comprising curing the planarizing pad material at an elevated temperature to strengthen and harden the planarizing pad material.

28. The method of claim 20 wherein the substrate material is a first substrate material, and wherein the method further comprises:
    attaching the planarizing pad material to an elongated second substrate material to form an elongated planarizing pad; and
    rolling the elongated planarizing pad upon itself to form a roll.

29. The method of claim 20 wherein irradiating the first portion of the planarizing pad material includes increasing a solubility of the first portion.

* * * * *